(12) United States Patent
Pagette et al.

(10) Patent No.: US 8,981,430 B2
(45) Date of Patent: Mar. 17, 2015

(54) BIPOLAR TRANSISTOR WITH LOW RESISTANCE BASE CONTACT AND METHOD OF MAKING THE SAME

(71) Applicant: International Business Machines Corporation, Armonk, NY (US)

(72) Inventors: Francois Pagette, Jefferson Valley, NY (US); Kathryn T. Schonenberg, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 18 days.

(21) Appl. No.: 13/710,953

(22) Filed: Dec. 11, 2012

(65) Prior Publication Data

US 2013/0095631 A1 Apr. 18, 2013

Related U.S. Application Data

(60) Division of application No. 12/535,310, filed on Aug. 4, 2009, now Pat. No. 8,357,953, which is a continuation of application No. 11/852,507, filed on Sep. 10, 2007, now abandoned.

(51) Int. Cl.
| | |
|---|---|
| H01L 29/73 | (2006.01) |
| H01L 29/66 | (2006.01) |
| H01L 29/10 | (2006.01) |
| H01L 29/737 | (2006.01) |
| H01L 29/08 | (2006.01) |

(52) U.S. Cl.
CPC ...... *H01L 29/66242* (2013.01); *H01L 29/1004* (2013.01); *H01L 29/7371* (2013.01); *H01L 29/0817* (2013.01)
USPC ........................... 257/197; 257/198; 438/317

(58) Field of Classification Search
USPC .................................. 257/198, 197; 438/317
See application file for complete search history.

(56) References Cited

U.S. PATENT DOCUMENTS

| | | | |
|---|---|---|---|
| 5,242,847 A | 9/1993 | Ozturk et al. | |
| 6,417,058 B1 | 7/2002 | Richardson et al. | |
| 6,551,889 B2 * | 4/2003 | Kovacic | 438/312 |
| 6,627,919 B2 | 9/2003 | Maa et al. | |
| 6,787,864 B2 | 9/2004 | Paton et al. | |
| 6,797,614 B1 | 9/2004 | Paton et al. | |
| 6,979,482 B2 | 12/2005 | Hartzell et al. | |
| 2005/0151165 A1 | 7/2005 | Chan et al. | |
| 2009/0065804 A1 | 3/2009 | Pagette et al. | |
| 2009/0174034 A1 | 7/2009 | Donkers et al. | |

* cited by examiner

*Primary Examiner* — Howard Weiss
*Assistant Examiner* — Tifney Skyles
(74) *Attorney, Agent, or Firm* — Yuanmin Cai; Roberts Mlotkowski Safran & Cole, P.C.

(57) ABSTRACT

Embodiments of the present invention provide a bipolar transistor with low resistance base contact and method of manufacturing the same. The bipolar transistor includes an emitter, a collector, and an intrinsic base between the emitter and the collector. The intrinsic base extends laterally to an extrinsic base. The extrinsic base further includes a first semiconductor material with a first bandgap and a second semiconductor material with a second bandgap that is smaller than the first bandgap.

19 Claims, 5 Drawing Sheets

BIPOLAR TRANSISTOR WITH LOW RESISTANCE BASE CONTACT AND METHOD OF MAKING THE SAME

FIELD OF THE INVENTION

The present invention relates generally to structures of semiconductor devices and method of manufacturing the same, and, more particularly, to a bipolar transistor structure having a low resistance base contact.

BACKGROUND

A bipolar transistor usually includes, for example, an emitter of generally n-doped semiconductor material, a base of generally p-doped semiconductor material, and a collector of generally n-doped semiconductor material. Among various elements and/or parts of a bipolar transistor is an intrinsic base where, during operation, most of the electric current flow through junctions formed by different types of materials. Semiconductor materials inside a bipolar transistor are usually in a crystalline form. That is, atom arrangement of the semiconductor materials generally forms a continuous lattice characterized by a lattice constant.

A Heterojunction Bipolar Transistor (HBT) normally refers to a bipolar transistor wherein a plurality of semiconductor elements such as, for example, Si and Ge are juxtaposed in the intrinsic base of the device to form, for example, a SiGe HBT. In addition to SiGe HBT, other well known HBT transistors may include, for example, AlGaAs/GaAs HBT and InP HBT. Materials inside a HBT transistor are normally arranged to take advantage of increased charge carrier mobility and quasi-static electrical field in the intrinsic base region. Because HBT transistors generally cause smaller delay in signal propagation, measured by a RC time constant, and higher oscillation or cutoff frequencies, they are favored over metal-oxide-semiconductor (MOS) transistors, particularly in high frequency electronic circuit applications, for high-end communication and radar equipment.

Recent HBT devices are usually formed vertically. For example, a HBT may have an emitter formed at the surface of a semiconductor substrate, an intrinsic base or intrinsic base region formed underneath the emitter, and a collector formed underneath the intrinsic base toward the bottom of the substrate. This configuration may be advantageous in forming a thin intrinsic base layer, which is known to be critical for the electrical performance of the device. In addition, the intrinsic base may extend laterally along the semiconductor surface to reach a metal contact on the substrate surface next to the emitter. This lateral extension region, between the intrinsic base and the metal contact, is generally referred to as an extrinsic base.

As is well known in the art, chemical elements and their relative ratios in forming the intrinsic base of a HBT transistor or HBT device are often carefully selected because each of these periodic table elements has a unique lattice constant. A large difference in lattice constant between juxtaposed materials may cause strain and/or stress in the lattice which, if sufficiently large, may ultimately lead to crystal dislocation and cause poor device performance.

The intrinsic base of a HBT transistor or HBT device is normally formed of semiconductor material in crystalline form. Materials forming the intrinsic base are usually deposited through, for example, a Chemical Vapor Deposition (CVD) process. Under controlled process conditions, within lattice constant constraints, and when being deposited over a crystalline substrate (such as the collector), the deposited semiconductor materials may be in crystalline form as well. In general, semiconductor materials of single crystal are more favorable than their poly-crystalline counterpart due to their advantageous electrical behavior.

It is also known in the art that it is advantageous to reduce the dimension of the extrinsic base, of a HBT transistor or device, which is in contact with the collector, in order to reduce parasitic capacitance that may cause RC delay. In a vertical bipolar transistor, one widely used technique toward achieving this goal, while still providing a lateral extension of the intrinsic base, is to introduce an oxide region, such as a Shallow Trench Isolation (STI) region, in-between the extrinsic base and the collector contact in the semiconductor substrate.

Semiconductor materials, such as silicon (Si), deposited over a dielectric material, such as oxide and/or nitride, usually form an amorphous arrangement or poly-crystalline, such as poly-silicon. Therefore, a HBT transistor may include a poly-silicon base (extrinsic base) over the STI region and a single crystalline base (intrinsic base) over the collector region. However, an extrinsic base is not exclusively formed of poly-crystalline. More generally, an extrinsic base may be formed of, in one or more sections or segments, either single crystal, poly-crystalline, or a combination of both.

The continuous improvement in semiconductor device performance has come to the limits that device performance are more and more dependent on the quality of contacts made by the device to the exterior, i.e., the connection of metal lines that link the semiconductor device to the outside world. For example, when a metal contact makes connection to a semiconductor device, there is a phase transition from metal to semiconductor material (such as silicon). On a microscopic level, this transition may lead to certain inherent physical property changes such as the formation of an energy barrier that may affect the flow of electrons during the device operation. Consequently, such barrier may result in loss of conductivity or introduction or increase of resistance of the contact.

Since these physical property changes are setting the limits to the device performance of an HBT device, it is desirable to reduce or, if possible, eliminate any potential detrimental impact, such as dramatic increase in resistance of a contact, caused by physical property changes at the phase transition between a semiconductor material and the metal of contact. In other word, there exists a need in the current art to overcome the deficiencies and limitations described hereinabove.

SUMMARY

Embodiments of the present invention provide a bipolar transistor or the structure of a bipolar transistor with low resistance base contact, and method of manufacturing the same.

According to one embodiment, the bipolar transistor may be a HBT and may include, among other elements, an extrinsic base formed by a plurality of semiconductor materials. More specifically, the extrinsic base may include at least a first semiconductor material with a first bandgap (energy gap) and a second semiconductor material contacting the first semiconductor material with a second bandgap being smaller than the first bandgap. In one embodiment, the first semiconductor material may be silicon (Si) and the second semiconductor material may be silicon-germanium (SiGe). The extrinsic base may be contacted by a composite material formed from a metal, e.g., nickel (Ni), and the second semiconductor material, e.g., SiGe. For example, the composite may be a nickel germanosilicide (NiSiGe).

According to another embodiment, the bipolar transistor may include an emitter being surrounded by one or more sets of spacers. The extrinsic base of different semiconductor materials of different bandgaps may be situated outside the spacers.

According to one embodiment, the spacers may be adjusted or fine tuned in size and/or in shape during manufacturing to form an extrinsic base of a semiconductor material of smaller bandgap, the extrinsic base being on top of another semiconductor material of a larger bandgap above a shallow trench isolation (STI) region.

According to another embodiment, the bipolar transistor may include at least an extrinsic base and an emitter. The extrinsic base and the emitter are separated by a set of sidewall spacers. The bipolar transistor may further include another set of sidewall spacers surrounding the emitter and encompassing the first set of sidewall spacers and part of the extrinsic base. The extrinsic base outside this set of spacers may be covered by a semiconductor material of narrow or small bandgap, which is subsequently covered by a silicide contact.

BRIEF DESCRIPTION OF THE SEVERAL VIEWS OF THE DRAWINGS

The present invention will be understood and appreciated more fully from the following detailed description of the invention, taken in conjunction with the accompanying drawings of which.

Figure 1:
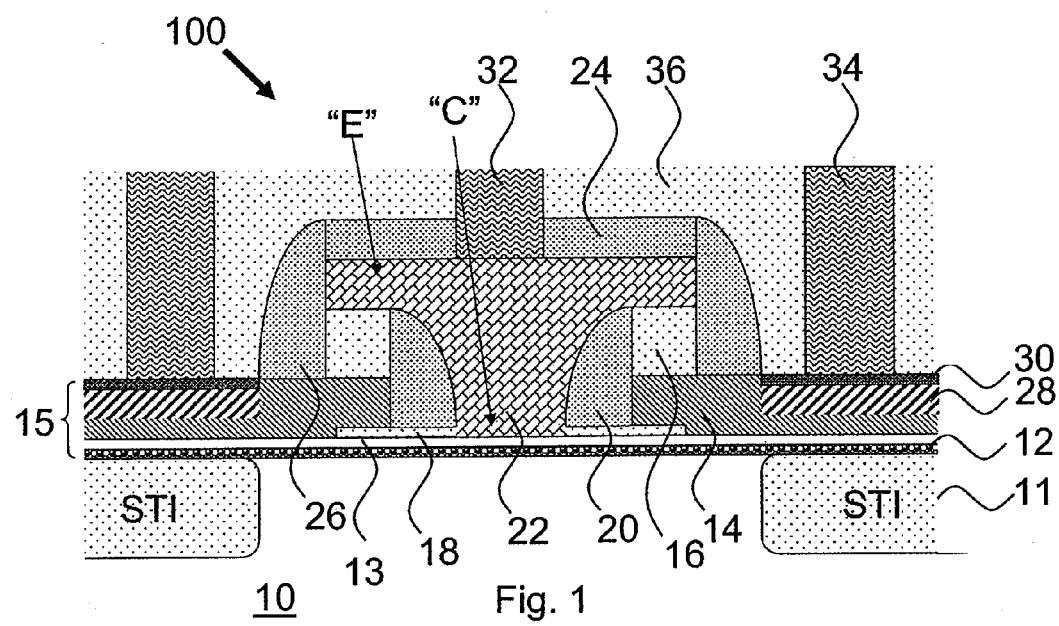
FIG. 1 is a schematic illustration of a bipolar transistor in accordance with embodiments of the present invention.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION

The present invention relates to structures of semiconductor devices and method of manufacturing the same. More specifically, the present invention provides a bipolar transistor having a layered structure of an extrinsic base made of a plurality of semiconductor materials of different bandgaps. Furthermore, the extrinsic base may include silicide contacts which may be a composite of silicon and metals such as, for example, nickel (Ni) or nickel alloys.

The present invention provides a technique with high manufacturability to lower the contact resistance of the base contact in a bipolar transistor. In brief, the bipolar transistor may be fabricated in a regular process up until the emitter formation, as is well known in the art. According to embodiment of the present invention, insulators are then removed from an extrinsic base layer, which may be a first semiconductor material, and spacers are formed at the side of the emitter. In one embodiment, the first semiconductor material may be a poly-silicon which is then recessed by wet or dry etching processes, leaving a thin layer of the first semiconductor material or any other semiconductor materials over an isolation structure, such as oxides or nitrides, underneath. The recesses are then filled with a second semiconductor conductor material with a bandgap which is smaller than that of the first semiconductor material. In more particular, the recesses are selectively filled with insitu-doped, such as boron-doped, SiGe, for example. In a further embodiment, SiGe may be grown over the first semiconductor material which may be poly-silicon, with or without the creation of the recesses. Contacts of silicide, for example, NiSiGe or NiPtSiGe or any other metal silicide, may be subsequently formed on top of the second semiconductor material to further reduce resistivity or resistance of the contacts.

FIG. 1 is a simplified illustration of a final structure of a bipolar transistor 100 in accordance with certain embodiments of the present invention. Bipolar transistor 100 may include, as part of an intrinsic base, a semiconductor layer 12 over a semiconductor substrate 10. Layer 12 may be, for example, a continuous layer of silicon germanium (SiGe) having a thickness in the range of about 400 to 600 Å, preferably around 500 Å. However the present invention is not limited in this respect. A person skilled in the art will appreciate that materials other than SiGe and thickness other than the range specified above may be used for layer 12. Upon layer 12, there may be a thin film or thin layer of silicon 13, which may also be part of the intrinsic base. Thickness of layer 13 may be in the range of 10 Å to 50 Å and may preferably be around 25 Å. A etch stop layer 18 may be on top of layer 13, which may be an oxide layer. In addition, substrate 10 underneath intrinsic base layers 12 and 13 may be surrounded or conductively isolated by one or more shallow trench isolation (STI) 11.

Bipolar transistor 100 may include a raised emitter 22 being conductively connected to the intrinsic base 12. Emitter 22 may be laterally isolated by non-conductive materials 20, 24 and 26, which may be for example nitride or oxide but other non-conductive materials may be used as well. According to some embodiment, non-conductive material 26 may be a first set of spacers or sidewall spacers and non-conductive material 20 may be a second set of spacers or sidewall spacers. Performance of bipolar transistor 100 may be adjusted or tuned during manufacturing by adjusting the size and/or shape of spacers 20 and/or 26, as described below in more details.

Bipolar transistor 100 may also include a first semiconductor material or layer of semiconductor material 14 of an extrinsic base 15, formed adjacent to the sidewall spacers 20. The extrinsic base material of layer 14 may be a boron doped poly-silicon (Si) and, according to one embodiment, may have a thickness ranging from about 600 nm to about 2000 nm although other thicknesses are also contemplated by the present invention. The extrinsic base material 14 has a certain bandgap (energy gap), and is conductively connected to, or in contact with, intrinsic base layers 12 and 13.

Bipolar transistor 100 may also include a second semiconductor material or layer of semiconductor material 28 of extrinsic base 15. According to one embodiment, extrinsic base of layer 28 may be formed in recesses created layer 14 and the material may have a smaller bandgap than that of extrinsic base material of layer 14. For example, the recesses may be filled with SiGe material 28 but the present invention is not limited in this respect and other suitable material may be used as extrinsic base material 28. According to another embodiment, a silicide contact or contact region 30 may be formed on the top of second semiconductor material 28. For example, a nickel (Ni) or nickel alloy may be used to form silicide contact 30 on layer 28 through, for example, an annealing process. In this case, silicide region 30 may be a NiSiGe or NiPtSiGe material.

FIG. 1 further illustrates that bipolar transistor 100 may be covered by dielectric material 36, and emitter 22 and extrinsic base 15 be connected to external contacts 32 and 34. Connection to extrinsic base 15 may be through silicide contact 30.

Figure 2:
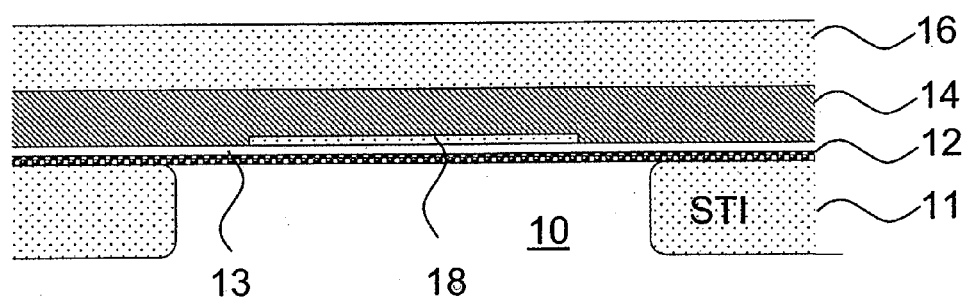
FIGS. 2-10 are schematic illustrations of a demonstrative process of manufacturing a bipolar transistor in accordance with embodiments of the present invention.

FIG. 2 through FIG. 10 are demonstrative illustrations of a process of manufacturing or forming bipolar transistor 100 of FIG. 1. Referring to FIG. 2, a substrate 10 is blanket covered with an intrinsic base which may include layers 12 and 13. Layer 12 may be, for example, a SiGe layer being deposited on substrate 10 having a suitable thickness, between about 400 Å and about 600 Å and preferably about 500 Å. Layer 13 may be, for example, a Si cap layer covering SiGe layer 12 with a suitable thickness in the range of 10 Å to 50 Å, preferably about 25 Å. One or more conventional methods known in the art may be used to form layers 12 and 13. Hereinafter, portions of layers 12 and 13 that are above substrate 10 and between shallow trench isolation (STI) regions 11 may be referred to as the intrinsic base, and portions of layers 12 and 13 on top of STI 11, together with other extrinsic base material formed thereupon, may be referred to as the extrinsic base 15 of bipolar transistor 100. STI 11 may be an oxide or nitride, and layers 12 and 13 formed thereupon may be in polycrystalline form.

On top of layer 13, an etch stop layer 18 may be deposited where emitter 22 is to be formed at a later stage of the process. Etch stop layer 18 may have a sufficient thickness such as to reduce and/or prevent possible damage from subsequent etching processes to the underlying intrinsic base layers 12 and 13. However, a person skilled in the art will appreciate that the use of an etch stop layer 18 may be optional depending on the processes used. For example, other now known or future developed techniques may be used to minimize or prevent possible damage to intrinsic base layers 12 and 13 during subsequent process.

Next, extrinsic base material 14 is blanket deposited over etch stop layer 18 and layers 12 and 13. Any conventional method and suitable material may be used to deposit and form layer 14. Preferably, for example, the material of layer 14 is p-doped poly-silicon but the present invention is not limited in this respect and other semiconductor material may be use as well. Layer 14, which is also part of the extrinsic base, has a preferable thickness between 600 nm and 2000 nm. Next, a dielectric layer 16 may be deposited to cover layer 14.

Figure 3:
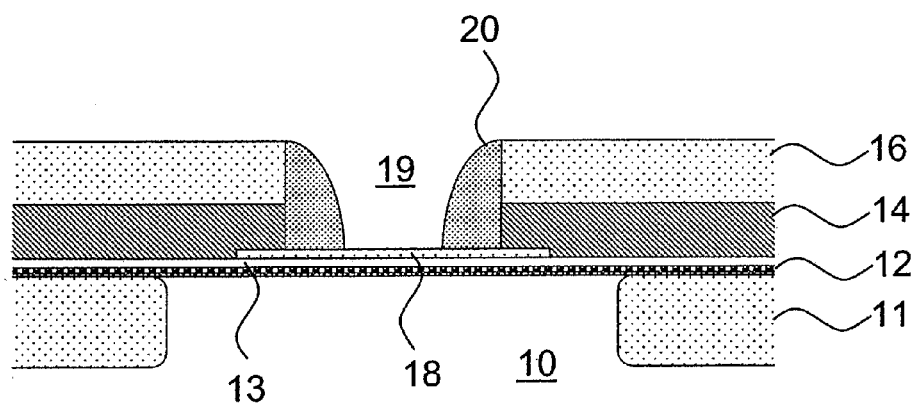

Referring to FIG. 3, an opening 19 may be formed inside layers 14 and 16 by any conventional etching processes. For example, the dielectric material of layer 16 may be removed by a wet etching process followed by the removal of portions of extrinsic base material of layer 14. The removal exposes etch stop layer 18. Prior to forming emitter 22 inside opening 19, spacers 20 may be formed to cover edges or side walls of opening 19. Any known or unknown non-conductive material such as, for example, nitride may be used as spacers. During manufacturing, the size of spacers 20 may be tuned or adjusted to have a thickness that is sufficient to electrically isolate the extrinsic base layer 14 from emitter 22 that is to be formed inside opening 19.

Figure 4:
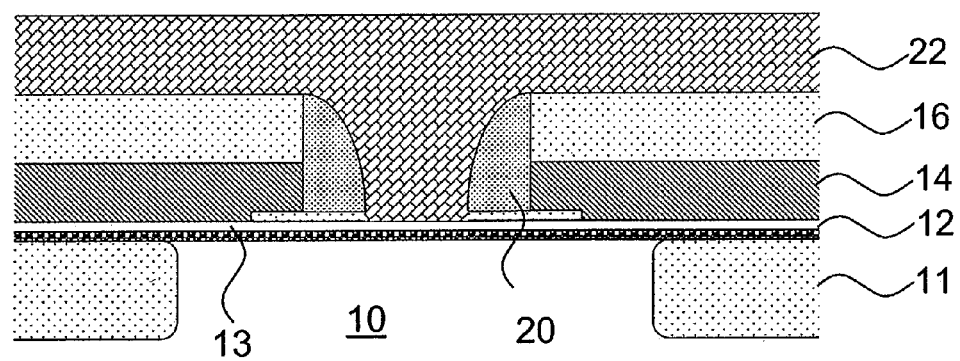

Referring to FIG. 4, which shows further manufacturing steps of forming bipolar transistor 100 according to embodiment of the present invention. As illustrated In FIG. 4, portions (exposed portions) of etch stop layer 18 may be removed by, for example, an acidic etch using HF or other conventional methods. Preferably, an etching method is used that does not damage the underlying intrinsic base layers 13 and 12. After the removal of uncovered etch stop layer 18, opening 19 may be subsequently filled with n-doped poly-silicon to form a raised emitter 22. Any conventional method and other suitable material may be used to form emitter 22.

Figure 5:
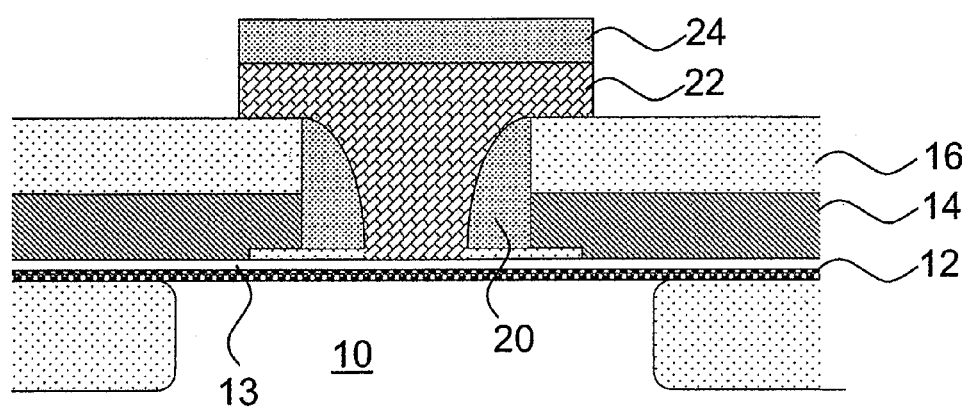

Referring to FIG. 5, a dielectric layer 24 is blanket formed, such as for example through deposition, over emitter 22. In embodiments, dielectric layer 24 may include nitride or oxide, but other protective and non-conductive materials are contemplated by the present invention. Subsequently, portions of dielectric layer 24 and emitter 22 are removed forming a T-shaped emitter 22 as illustrated in FIG. 5. Any conventional method can be used to remove these portions. For example, lithographic patterning and etching processes may be used to remove these portions of layer 24 and emitter 22.

Figure 6:
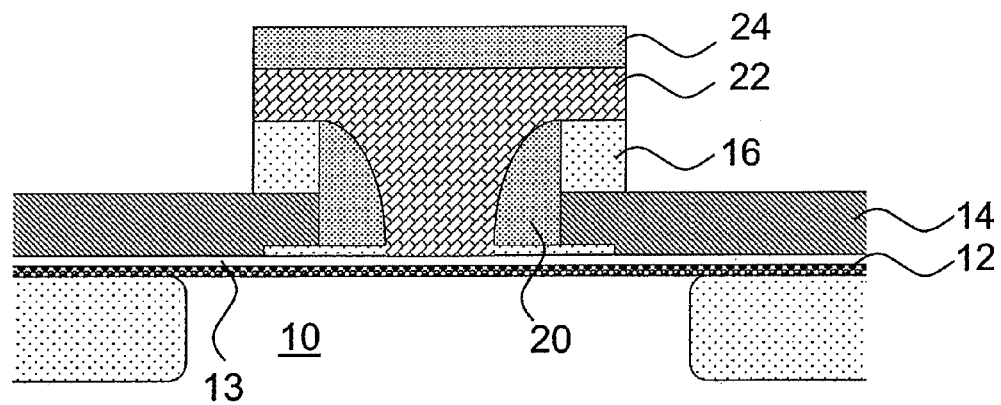

Referring to FIG. 6, the unprotected portions of dielectric layer 16 may be removed using any conventional processes such as, for example, a reactive-ion-etching (RIE) process. This process exposes portions of extrinsic base 14. Once extrinsic base 14 becomes accessible, according to embodiment of the present invention, low resistance base contacts may be prepared in the manner as described below in more detail.

Figure 7:
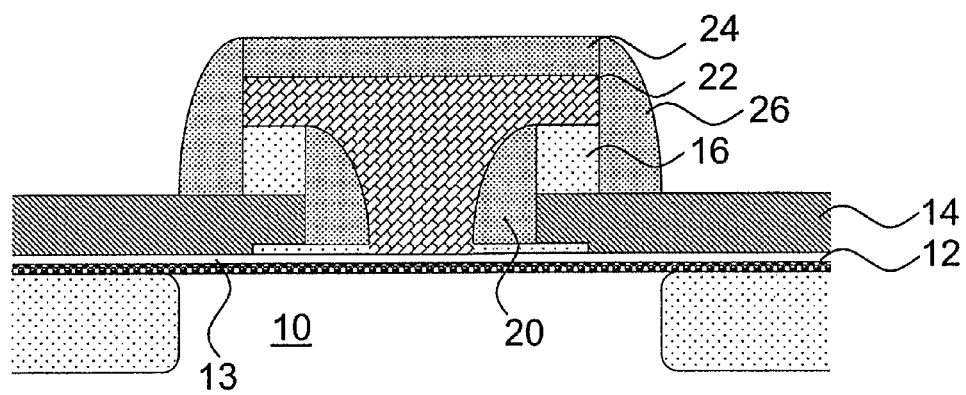

Referring to FIG. 7, sidewall spacers 26 are deposited to protect and conductively isolate the emitter 22 and portions of the extrinsic base 14 from subsequent processes steps. As discussed above, sidewall spacers 26 are adjustable or tunable during manufacturing, in such that the thickness of sidewall spacers 26 may be designed or tailored to meet any particular desired device characteristics. For example, in one embodiment, sidewall spacers 26 may be aligned with STI 11. In other words, thickness of sidewall spacers 26 may be made such that edges of spacers 26 may be aligned with, or beyond, that of STI 11. This provides the advantage that the poly material of extrinsic base 14 may exhibit minimal or no stress, as being compared with that of underlying Si substrate 10. A person skilled in the art will appreciate that any materials such as, for example, silicon nitride or silicon oxide that is suitable for protecting and electrically isolating emitter 22 from extrinsic base 14 may be used as sidewall spacers.

Figure 8:
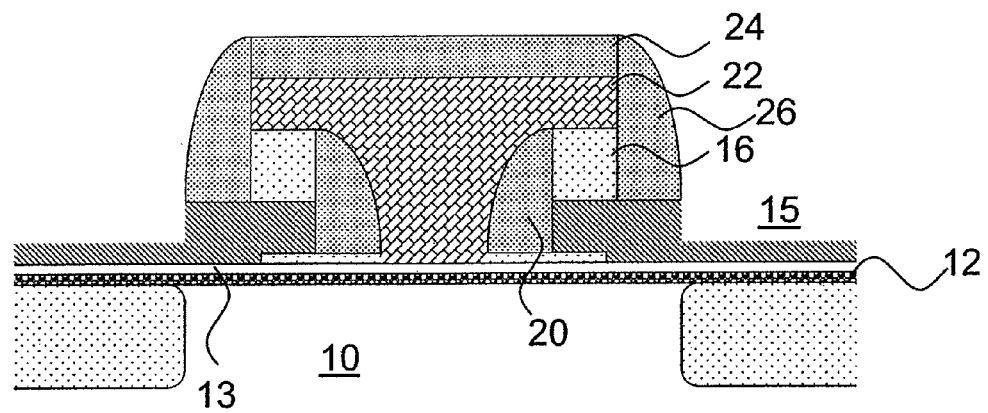

Referring to FIG. 8, portions of the extrinsic base layer 14 may be removed to form a recess 15 according to one embodiment of the present invention. The thickness of remaining extrinsic base layer 14 may be about 5 nm; however, the remaining thickness may be greater or less 5 nm. According to another embodiment, layer 14 of extrinsic base that is not covered by sidewall spacers 26 may be removed entirely to expose layers 13.

Figure 9:
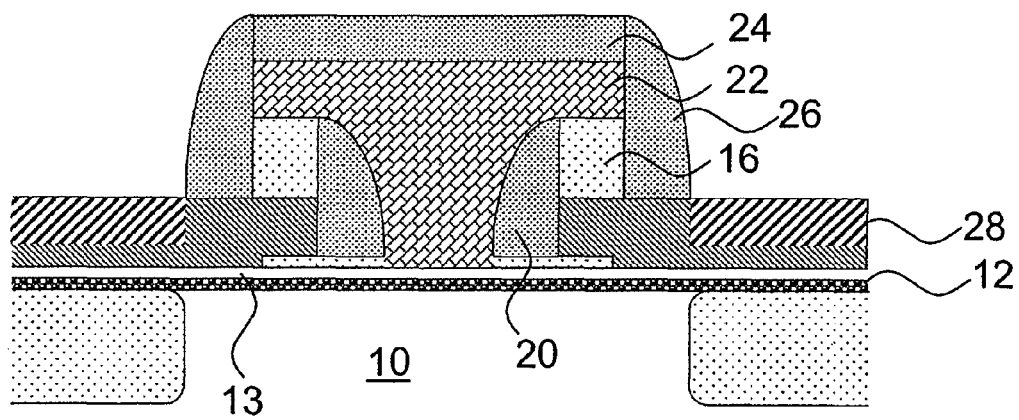

Referring to FIG. 9, recesses 15 are filled with extrinsic base material 28, preferably p-doped material, and more preferably boron-doped material. Extrinsic base material 28 may be different from extrinsic base material 14 and thus have different bandgap from that of extrinsic base material 14. According to one embodiment of the present invention, extrinsic base material 28 may be doped with boron and may have electro-physical properties that will bring reduced contact resistance while maintaining desired semiconductor properties (e.g., hole mobility). For example, extrinsic base material 14 may be silicon (Si) and extrinsic base material 28 may be boron doped SiGe material. Boron-doped SiGe material may have a germanium content between about 5 and about 50 atomic percentage, and preferably between about 15 and about 35 atomic percentage. It is known in the art that p-doped SiGe has a much reduced contact resistance when being compared with that of similar p-doped silicon.

As a person skilled in the art will appreciate that low contact resistivity or resistance is generally desired in order to improve performance and efficiency of a semiconductor device. According to embodiment of the present invention, SiGe material having a germanium content between 5 and 50 atomic percentage, and more preferably between 15 and 35 atomic % may be used for extrinsic base 28 in order to achieve desirable device performance.

Figure 10:
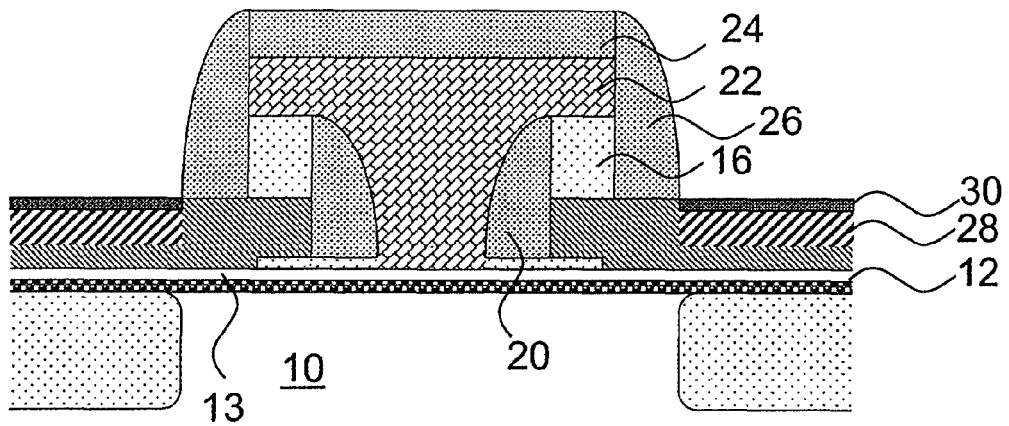

Referring to FIG. 10, which illustrates an additional fabrication step in forming bipolar transistor 100 in accordance with embodiment of the invention. In FIG. 10, a layer of nickel or nickel alloy 30 may be formed through, for example, sputtering on top of the SiGe extrinsic layer 28. The nickel or nickel alloy is then annealed at elevated temperatures, for example at 400 degree C., to form NiSiGe silicide or NiPtSiGe silicide. Although in the above demonstrative example, nickel and nickel alloys (such as nickel platinum) are used, any metal elements may be contemplated as a sputtering material, either by itself or in alloy with any other metal, to form silicide contact in order reduce the contact resistivity or resistance. For example, it is contemplated that metal such as cobalt or iridium or rhodium or osmium either by itself or in alloy with each other or other metals such as platinum or nickel may be used to reduce contact resistivity.

It shall be understood that Si and SiGe inherently have different lattice constants such that stresses may occur at their contact interface. Furthermore, when subjecting to certain environment temperatures, a semiconductor material that was applied amorphously may rearrange in parts to form crystallites thereby subjecting its surroundings to stresses. It is generally desirable to keep stresses to a minimal, which may be attained by carefully conducting processing steps to minimize stress induction. For example, in one implementation embodiment, the stresses may be isolated by tuning or adjusting the spacers or sidewall spacers.

For example, in order to minimize the effects of stress on emitter 22, the distance between the center of the emitter "C" and the SiGe should be tuned or adjusted accordingly. As briefly discussed above, this distance can be monitored and tuned by the thicknesses of the sidewalls or sidewall spacers 20 and 26, as well as the size of emitter portion "E" as shown in FIG. 1. Thus, by adjusting the processing parameters to increase or decrease the thickness of sidewalls 20 and 26 or the length of the emitter portion "E", undesired effect of stresses on the emitter may be minimized or reduced. That is, any undesirable effects of stresses may be minimized by increasing the distance between the base contact portion (e.g., reference numerals 28, 30) and the portion "C" of emitter 22; where the increase in distance is provided by an increased thickness of the sidewalls or the portion "E" of the emitter thus effectively pushing the base contact portion farther away from the portion "C" of the emitter. However, the present invention is not limited in this respect and shapes of other than the "T" shape shown in FIG. 1 may be used as well.

The methods as described above are used in the fabrication of integrated circuit chips. The resulting integrated circuit chips may be distributed by the manufacturer in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multi-chip package (such as a ceramic carrier that has either or both surface interconnections or buried interconnections). In any case the chip may further be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to high-end advanced computer products having a display, a keyboard or other input device, and a central processor.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A method of manufacturing a bipolar transistor, the method comprising:
   providing a semiconductor substrate as a collector;
   forming an intrinsic base on said semiconductor substrate;
   forming an extrinsic base on an outer portion of said intrinsic base, said extrinsic base having a first layer of a first semiconductor material;
   forming an emitter on an inner portion of said intrinsic base, said emitter being separated from said extrinsic base by one or more sets of spacers;
   forming a second layer of a second semiconductor material of said extrinsic base, said second semiconductor material having a smaller bandgap than that of said first semiconductor material;
   forming a first set of tunable non-conductive sidewall spacers defining edges of said extrinsic base away from said emitter and directly on said first semiconductor material;
   forming a recessed portion of said first semiconductor material such that a surface of said first semiconductor material adjacent to said first set of tunable non-conductive sidewall spacers has an upper surface at a lower height than a surface under said first set of tunable non-conductive sidewall spacers; and
   forming said second semiconductor material directly on the upper surface of said recessed portion of said first semiconductor material.

2. The method of claim 1, wherein forming said second layer of said second semiconductor material of said extrinsic base comprises creating a recess in said first layer of said first semiconductor material, and fill said recess with said second semiconductor material, wherein said first semiconductor material is silicon (Si) and said second semiconductor material is silicon-germanium (SiGe) having a germanium content between about 5 and 50 atomic percentage.

3. The method of claim 1, further comprising forming a silicide contact on top of said second semiconductor material using nickel or nickel alloy.

4. The method of claim 1, wherein forming said second layer of said second semiconductor material comprises applying a set of spacers to align said second semiconductor material with a shallow trench isolation structure underlying said extrinsic base.

5. The method of claim 1, wherein said collector is formed underneath said intrinsic base.

6. The method of claim 1, further comprising forming a silicide contact on a top surface of said second semiconductor material.

7. The method of claim 6, wherein said silicide contact is formed through silicidation of a nickel or nickel alloy.

8. The method of claim 7, wherein said nickel alloy comprises platinum.

9. The method of claim 1, wherein said first semiconductor material is silicon (Si) and said second semiconductor material is boron-doped silicon-germanium (SiGe).

10. The method of claim 9, wherein said boron-doped SiGe has a germanium (Ge) content between about 5 and about 50 atomic percentage.

11. The method of claim 9, wherein said second semiconductor material is formed within a recess of said first semiconductor material.

12. The method of claim 1, wherein said set of spacers are formed such that edges of said spacers are in substantial alignment with edges of a set of isolation structures which underlies said extrinsic base.

13. The method of claim 1, wherein said emitter is conductively separated from said extrinsic base by a set of spacers formed on top of said intrinsic base and adjacent to said emitter, via an optional etch stop layer.

14. A method of manufacturing a bipolar transistor, the method comprising: providing a semiconductor substrate as a collector; forming an intrinsic base on said semiconductor substrate; forming an extrinsic base on an outer portion of said intrinsic base, said extrinsic base having a first layer of a first semiconductor material; forming an emitter on an inner portion of said intrinsic base, said emitter being separated from said extrinsic base by one or more sets of spacers; forming a second layer of a second semiconductor material of said extrinsic base, said second semiconductor material having a smaller bandgap than that of said first semiconductor material; forming a first set of tunable non-conductive sidewall spacers defining edges of said extrinsic base away from said emitter and directly on said first semiconductor material; forming a recessed surface of said first semiconductor material; and forming said second semiconductor material on said first semiconductor material in said recessed surface portion, wherein said recessed surface of said first semiconductor material is adjacent to said first set of tunable non-conductive sidewall spacers and has an upper surface at a lower height than a surface under said first set of tunable non-conductive sidewall spacers, and said second semiconductor material is formed directly on said recessed surface of said first semiconductor material.

15. The method of claim 14, wherein:
said recessed portion of said first semiconductor material forms a stepped portion of said first semiconductor material;
said extrinsic base is defined by said first set of tunable non-conductive sidewall spacers formed on top of said first semiconductor material and adjacent to sidewalls of said emitter; and
said first set of tunable non-conductive sidewall spacers are formed such that edges of said spacers are in substantial alignment with edges of a set of isolation structures which underlies said extrinsic base, and an edge of said recessed portion.

16. The method of claim 14, wherein said first semiconductor material has a first bandgap (energy gap) and said second semiconductor material has a second bandgap, said second bandgap being smaller than said first bandgap.

17. The method of claim 14, further comprising forming a set of tunable non-conductive spacers on top of an intrinsic base and separating said emitter from said extrinsic base, said intrinsic base extending laterally to said extrinsic base.

18. The method of claim 17, wherein said set of non-conductive spacers are formed on the etch stop layer directly contacting the edge of said extrinsic base and the emitter.

19. The method of claim 1, wherein said first semiconductor material comprising said recessed portion has a first thickness and said first semiconductor material further has a portion with a second thickness, different from said first thickness.

* * * * *